(12) United States Patent
Ng et al.

(10) Patent No.: US 7,342,528 B2
(45) Date of Patent: Mar. 11, 2008

(54) CIRCUIT AND METHOD FOR REDUCING ELECTROMAGNETIC INTERFERENCE

(75) Inventors: Wai Tung Ng, Thornhill (CA); Olivier Trescases, Toronto (CA)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 11/424,499

(22) Filed: Jun. 15, 2006

(65) Prior Publication Data
US 2007/0290894 A1   Dec. 20, 2007

(51) Int. Cl.
*H02M 1/80*   (2006.01)
(52) U.S. Cl. ..................... 341/153; 375/130
(58) Field of Classification Search ............... 341/143, 341/144, 153, 118; 375/130, 367, 373; 323/322; 713/501; 327/158, 148, 156
See application file for complete search history.

(56) References Cited

U.S. PATENT DOCUMENTS

| | | | |
|---|---|---|---|
| 4,818,955 A * | 4/1989 | Hwang | 331/78 |
| 5,318,034 A * | 6/1994 | Ishida et al. | 600/447 |
| 5,594,631 A | 1/1997 | Katoozi et al. | |
| 5,631,920 A * | 5/1997 | Hardin | 375/130 |
| 6,014,063 A * | 1/2000 | Liu et al. | 331/78 |
| 6,249,249 B1 * | 6/2001 | Obayashi et al. | 342/371 |
| 6,249,876 B1 * | 6/2001 | Balakrishnan et al. | 713/501 |
| 6,687,319 B1 * | 2/2004 | Perino et al. | 375/367 |
| 6,822,595 B1 * | 11/2004 | Robinson | 341/144 |
| 6,841,983 B2 * | 1/2005 | Thomas | 323/322 |
| 6,960,961 B2 * | 11/2005 | Andrews | 331/18 |
| 7,034,609 B2 | 4/2006 | Risbo et al. | |
| 7,208,988 B2 * | 4/2007 | Murata et al. | 327/148 |
| 7,233,637 B2 * | 6/2007 | Propp et al. | 375/373 |

| | | | |
|---|---|---|---|
| 2004/0076221 A1 * | 4/2004 | Refaeli et al. | 375/130 |
| 2004/0217748 A1 | 11/2004 | Andrews | |
| 2005/0012649 A1 | 1/2005 | Adams et al. | |

(Continued)

FOREIGN PATENT DOCUMENTS

GB   2 326 036   * 12/1998

(Continued)

OTHER PUBLICATIONS

K.K. Tse, Henry S.H. Chung, S.Y.R. Hui, H.C. So; A Comparative Study of Using Random Switching Schemes for DC/DC Converters; Proceedings, IEEE Applied Power Electronics Conference and Exposition, 1999, vol. 1, pp. 160-166.

(Continued)

*Primary Examiner*—Peguy JeanPierre
(74) *Attorney, Agent, or Firm*—Rennie William Dover

(57) ABSTRACT

A spread spectrum system having a self-oscillating delay-line digital pulse width modulator and a method for mitigating electromagnetic interference. The spread spectrum system has a pseudo-random pattern generator connected to a digital-to-analog converter, which in turn is connected to a linear regulator. The linear regulator receives a reference voltage from the digital-to-analog converter and creates a frequency varying voltage that serves as an input voltage for delay elements of a delay-line based digital pulse width modulator. In response to frequency varying input signal, the delay-line based digital pulse width modulator generates a frequency varying voltage that is input to a switching network to vary its switching frequency.

17 Claims, 3 Drawing Sheets

U.S. PATENT DOCUMENTS

2005/0254573 A1 11/2005 Midya et al.

FOREIGN PATENT DOCUMENTS

| JP | 2006209388 | * | 8/2006 |
|---|---|---|---|
| WO | 2003050637 | | 6/2003 |

OTHER PUBLICATIONS

Tim Regan, Doug La Porte; Easy-to-Use Spread Spectrum Clock Generator Reduces EMI and More; Linear Technology Magazine, Feb. 2004, pp. 6-12.

Jeyanandh Paramesh, Annette Von Jouanne; Use of Sigma-Delta Modulation to control EMI from Switch-Mode Power Supplies; IEEE Transactions on Industrial Electronics, Feb. 2001, vol. 48, No. 1, pp. 111-117.

M. Kuisma; Variable Frequency Switching in Power Supply EMI-Control: An Overview; IEEE Aerospace and Electronic Systems Magazine, Dec. 2003, vol. 18, pp. 18-22.

Angel V. Peterchev, Seth R. Sanders; Quantization Resolution and Limit Cycling in Digitally Controlled PWM Converters; Department of Electrical Engineering and Computer Science, University of California, Berkeley, Printed from Internet, Date unknown.

Randy Roberts; The ABCs of Spread Spectrum—A Tutorial, www.sss-mag.com/ss.html, website accessed May 21, 2006, 8 pages.

Bin Huo, Andrzej, M. Trzynadlowski;Random Pulse Width PWM Modulator for Inverter-fed Induction Motor Based on the TMS320F240 DSP Controller; University of Nevada, Electrical Engineering Dept. Reno, NV 89557, USA, Printed from the Internet, Date unknown, no date.

* cited by examiner

CIRCUIT AND METHOD FOR REDUCING ELECTROMAGNETIC INTERFERENCE

FIELD OF THE INVENTION

This invention relates, in general, to electronic circuits and, more particularly, to spread spectrum operation of digitally controlled power converters.

BACKGROUND OF THE INVENTION

Systems such as automotive, aviation, telecommunications, consumer electronics, etc. comprise many elements that may be adversely affected by physical, environmental, and electrical stresses. These elements include electronic components, passive circuit elements, and interconnect structures. One type of stress that interferes with the proper operation of an electrical system is electromagnetic radiation. This type of stress is also referred to as Electromagnetic Interference ("EMI"). In addition to being affected by EMI, the electronic components also radiate electromagnetic signals, which may adversely affect other circuit components either in the same system or in other systems. As the desire for smaller more compact systems has increased, systems manufacturers have decreased the sizes of their systems, which increases the likelihood that radiated EMI will affect the system. For example, switched mode power supplies ("SMPS's"), which are used in portable computers, hand-held devices such as cellular phones, personal digital assistants, and electronic games, among others, are typically one of the worst sources of EMI. Because the sizes modern electronic systems have decreased, components that are sensitive to EMI may be located in close proximity to the power supplies thereby increasing their probability of malfunction due to the EMI.

Passive techniques for mitigating the effects of radiated EMI in electronic systems comprising SMPS's have included the use of EMI snubbers. However, snubbers are expensive and increase the size of the electronic system. Active techniques for addressing radiated and conducted EMI rely on varying the switching frequency of the SMPS. These techniques include the use of pseudo random clocks, frequency-modulated clocks, chaotic peak current control, and delta sigma modulation to achieve variable frequency operation. By varying the switching frequency, the noise generated by the SMPS is spread in the frequency domain and the fundamental peak is significantly reduced. A drawback with these techniques is that they have only been realizable in analog feedback controllers.

Hence, a need exists for a circuit and method that mitigates the effects of radiated and conducted EMI that can be applied to SMPS's having digital feedback controllers. In addition, it is desirable for the circuit and method to be cost and power efficient.

BRIEF DESCRIPTION OF THE DRAWINGS

The present invention will be better understood from a reading of the following detailed description, taken in conjunction with the accompanying drawing figures, in which like reference characters designate like elements, and in which.

DETAILED DESCRIPTION

In general, the present invention includes a method and circuit for reducing or inhibiting electromagnetic interference using a digital circuit architecture and spread spectrum clock generation. In accordance with an embodiment of the present invention, the switching frequency of a circuit is varied using a digital pseudo-random pattern generator and a delay-line digital pulse width modulator to create a digital spread spectrum, which is also referred to as a randomized pulse width modulation signal. The pseudo-random pattern generator transmits pseudo-random digital codes to a noise shaping digital-to-analog converter. The delay-line digital pulse width modulator generates a system clock signal having a frequency that is controlled by an analog supply voltage for the delay-line whose value is randomized around an average value. This varying clock frequency spreads the radiated and conducted EMI over a wide range of frequencies in a random fashion rather than at a constant frequency. This in effect reduces the average interference that other circuits in the vicinity of the power converter will experience.

Figure 1:
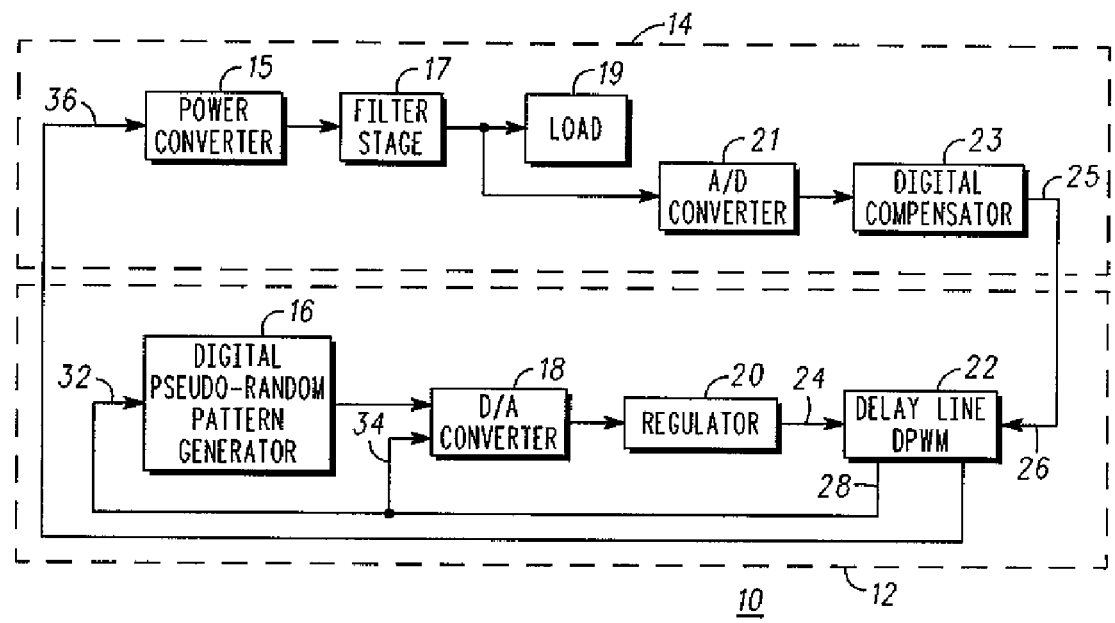
FIG. 1 is a block diagram of a digitally controlled power converter in accordance with an embodiment of the present invention.

FIG. 1 is a block diagram of a digitally controlled power converter 10 having a spread spectrum system for reducing EMI in accordance with an embodiment of the present invention. What is shown in FIG. 1 is spread spectrum system 12 connected to a switching network 14. Spread spectrum system 12 comprises a pseudo-random pattern generator 16, a Digital-to-Analog Converter ("DAC") 18, a linear regulator 20, and a delay-line based digital pulse width modulator ("DPWM") 22. More particularly, an input of DAC 18 is connected to an output of digital pseudo-random pattern generator 16 and an output of DAC 18 is connected to an input of linear regulator 20. An input 24 of delay-line based DWPM 22 is connected to an output of linear regulator 20 and an input 26 of delay-line based DPWM 22 is coupled to an output of switching network 14. Delay-line based DPWM 22 has an output 28 connected to an input 32 of pseudo-random pattern generator 16 and to an input 34 of DAC 18 and an output 30 connected to an input 36 of switching network 14.

By way of example switching network 14 comprises a power converter 15 having an input that serves as input 36 of switching network 14 and an output connected to an input of a filter stage 17. An output of filter stage 17 is connected to a load 19 and to an input of an Analog-to-Digital Converter ("ADC") 21. It is should be noted that the subtraction of the power converter output voltage from the desired reference voltage is implemented within ADC 21. The output of ADC 21 therefore represents the digitized equivalent of the difference between the reference voltage and the output voltage. An output of ADC 21 is connected to an input of a digital compensator 23 and an output of digital compensator 23 serves as an output 25 of switching network 14. The configuration of switching network 14 is not a limitation of the present invention. Switching network 14 can be any suitable digital circuit or controller architecture using a DPWM to regulate its output voltage. Embodiments of pseudo-random pattern generator 16, DAC 18, and delay-line based DPWM 22 are further described with reference to FIGS. 2-4, respectively. Embodiments of power converter 15 and filter stage 17 are further described with reference to FIG. 6.

Figure 2:
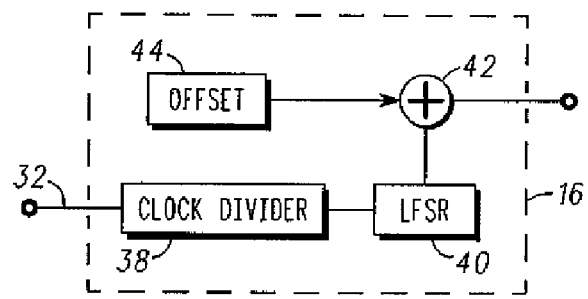
FIG. 2 is a block diagram of a portion of the digitally controlled power converter of FIG. 1 in accordance with another embodiment of the present invention.

Referring now to FIG. 2, a block diagram of pseudo-random pattern generator 16 in accordance with an embodiment of the present invention is illustrated. Pseudo-random pattern generator 16 comprises a clock divider circuit 38 having an input that serves as input 32. Clock divider circuit 38 sets an Over-Sampling Ratio ("OSR"). By way of example, the OSR is 4096. An output of pattern generator 16 is connected to an input of a Linear Feedback Shift Register ("LFSR") 40 and an output of LFSR 40 is connected to a summing circuit 42. An offset 44 is transmitted to another input of summing circuit 42. An output signal of summing circuit 42 serves as the output signal of pattern generator 16.

Figure 3:
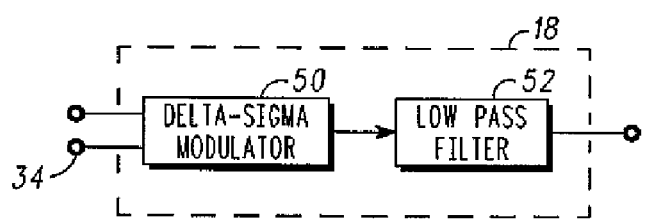
FIG. 3 is a block diagram of another portion of the digitally controlled power converter of FIG. 1 in accordance with another embodiment of the present invention.

Referring now to FIG. 3, a block diagram of DAC 18 is shown. DAC 18 comprises a delta-sigma modulator 50 coupled to a low-pass filter 52 and serves as a noise shaping circuit. Delta-sigma modulator 50 has an input that serves as input 34 and generates the analog voltage reference for linear regulator 20. DAC 18 receives pseudo-random digital codes from pseudo-random pattern generator 16. In accordance with one embodiment, DAC 18 has a sampling rate set by clock divider circuit 38. The sampling rate is given by EQT. 1:

$$f_{DAC} = f_{sys}/OSR \qquad \text{EQT. 1}$$

where:

$f_{DAC}$ is the sampling rate;
$f_{sys}$ is the system clock frequency; and
OSR is the over-sampling rate.

By way of example, delta-sigma modulator 50 is a first order delta-sigma modulator having a Noise Transfer Function ("$N_{TF}(z)$") given by EQT. 2:

$$N_{TF}(z) = 1 - z^{-1} \qquad \text{EQT. 2}$$

For a first order delta-sigma modulator, the noise falls by 9 decibels (dB), and hence the effective resolution increases by 1.5 bits for every doubling of the over-sampling rate. An advantage of using a one-bit delta-sigma topology is that it generates a highly linear output, has substantially zero quiescent current (and is therefore a low power circuit structure), and can be manufactured using monolithic integrated circuit manufacturing techniques.

Figure 4:
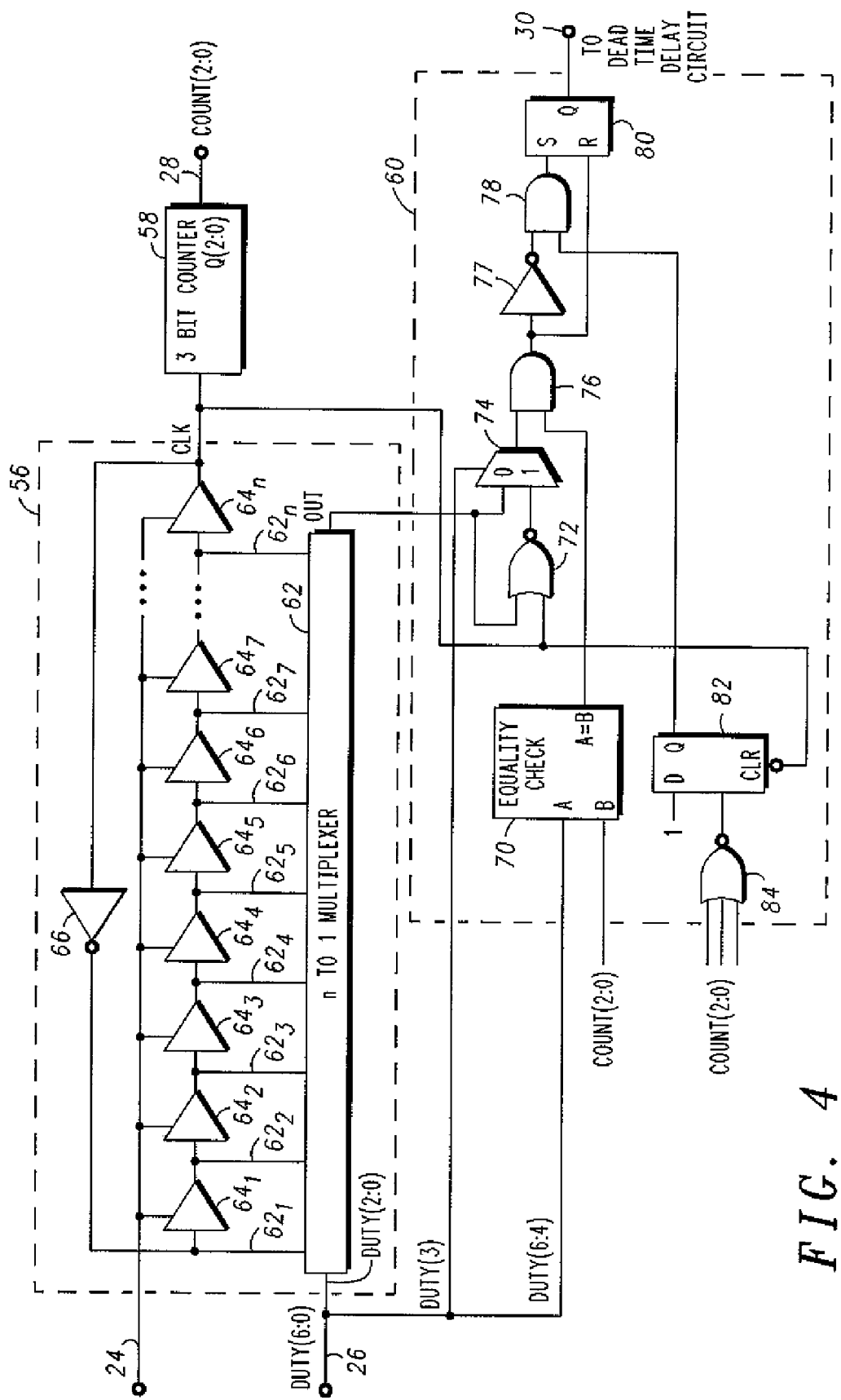
FIG. 4 is a schematic diagram of another portion of the digitally controlled power converter of FIG. 1 in accordance with another embodiment of the present invention.

Referring now to FIG. 4, a block diagram of delay-line based DPWM 22 in accordance with an embodiment of the present invention is illustrated. DPWM 22 comprises a delay line 56 connected to a counter 58 and DPWM logic circuit 60. Delay line 56 comprises an n-to-1 multiplexer 62 connected to "n" latch-based delay elements $64_1$, $64_2$, $64_3$, $64_4$, $64_5$, $64_6$, $64_7$, ..., $64_n$, where "n" represents an integer. Delay element $64_1$ has an input connected to an input $62_1$ of multiplexer 62 and an output commonly connected to an input $62_2$ of multiplexer 62 and to an input of delay element $64_2$. Similarly, delay elements $64_2$-$64_7$ have outputs connected to inputs $62_3$-$62_n$ of multiplexer 62 and to inputs of delay elements $64_3$-$64_n$, respectively. By way of example, multiplexer 62 is an 8-to-1 multiplexer having a 3-bit select bus, i.e., bits DUTY (2:0). The output of delay element $64_n$ is coupled to the input of delay element $64_1$ through an inverter 66 and serves as a clock output of delay line 56. The output of delay line 56 is connected to the input of counter 58. Multiplexer 62 has an input which serves as input 26 and an output for transmitting an output signal OUT. The size of multiplexer 62 and the number of delay elements is not a limitation of the present invention.

An N-bit hybrid DPWM includes a delay-line having $2^M$ elements to generate fine delay, followed by a $2^{(N-M)}$-bit counter to provide coarse delay adjustment, where N and M are integers. In accordance with the embodiment shown in FIG. 4, DPWM 22 is a 7-bit DPWM having an eight element delay line oscillator which provides a clock signal, CLK, having a frequency of eight times the switching frequency $f_S$. It should be noted that the type of delay-line based DPWM is not a limitation of the present invention. Other suitable delay line DPWM's include a hybrid DPWM, a segmented or non-segmented DPWM, a self-calibrated DPWM, or combinations thereof.

Figure 5:
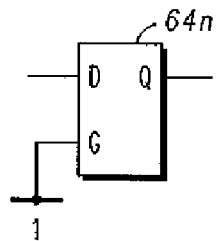
FIG. 5 is a schematic diagram of another portion of the digitally controlled power converter of FIG. 1 in accordance with another embodiment of the present invention.

Briefly referring to FIG. 5, a schematic of a delay element such as delay elements $64_1$-$64_n$ is shown. The architecture of the delay elements is not a limitation of the present invention. For example, the architecture of the delay elements or cells may include current-starved inverter architectures or an alternative logic gate architecture. The present invention can be applied to these alternative delay cell architectures by connecting the output of DAC 18 to the appropriate delay control terminal of the generic delay cell. If the delay of the delay cell is controlled using a terminal that does not require DC current, linear regulator 20 may be omitted.

Referring again to FIG. 4 and in accordance with one example, counter 58 is a 3-bit counter having an output for transmitting a three bit output signal count (2:0), wherein the output of counter 58 serves as output 28.

DPWM logic circuit 60 comprises an equality check circuit 70, a NOR gate 72, a multiplexer 74, AND gates 76 and 78, an inverter 77, latches 80 and 82, and a NOR gate 84. Equality check circuit 70 is also referred to as an equality checker and has an input connected to input 26 of multiplexer 62 and an input connected to output 28 of counter 58. In addition, the input connected to input 26 is connected to an output of a 2-to 1 multiplexer 74. An output of equality checker 70 is connected to an input of AND gate 76. One input of multiplexer 74 is connected to the output of n-bit multiplexer 62 and to an input of NOR gate 72. The other input of NOR gate 72 is connected to the output of delay element 56 and to the input of counter 58. The output of NOR gate 72 is connected to the other input of multiplexer 74. The output of multiplexer 74 is connected to a second input of AND gate 76. The output of AND gate 76 is coupled to an input of AND gate 78 through inverter 77 and to an input of latch 80. The output of latch 78 is connected to another input of latch 80. The output of latch 80 serves as output 30 of DPWM 22. The inputs of NOR gate 84 are connected to the outputs of counter 58 and the output of NOR gate 84 is connected to an input of latch 82. Latch 82 has an input coupled for receiving a logic high signal, i.e., a logic 1, and an input connected to the output of delay line 56.

The delay through a single element, $\Delta t$, corresponds to one Least Significant Bit ("LSB") of the PWM resolution. Therefore, a total resolution of 3 bits can be obtained by tapping the 8-element delay-line. It should be noted that including NOR gate 72 and 2-1 multiplexer 74 allows for the extraction of extra timing information from delay line 56, which can be used to generate a signal at the output of 2-1 multiplexer 74 having an effective timing resolution of 4 PWM bits. For example, when signal duty(3) is a logic zero, the tapped delay-line output (3-bit) is sufficient and is passed through 2-1 multiplexer 74. However, when signal duty(3) changes to a logic 1, it is desirable to add and extra delay equal to 8 times Δt to the tapped delay-line output. This delay is added by selecting the output of NOR gate 72 to pass through 2-1 multiplexer 74. The final PWM pulse is generated by latch 80 which is set at the beginning of each switching period by D-Flip-Flop 82 and reset when the combination of the output signal of counter 58 and the output signal of delay-line 56 matches the desired duty cycle.

Figure 6:
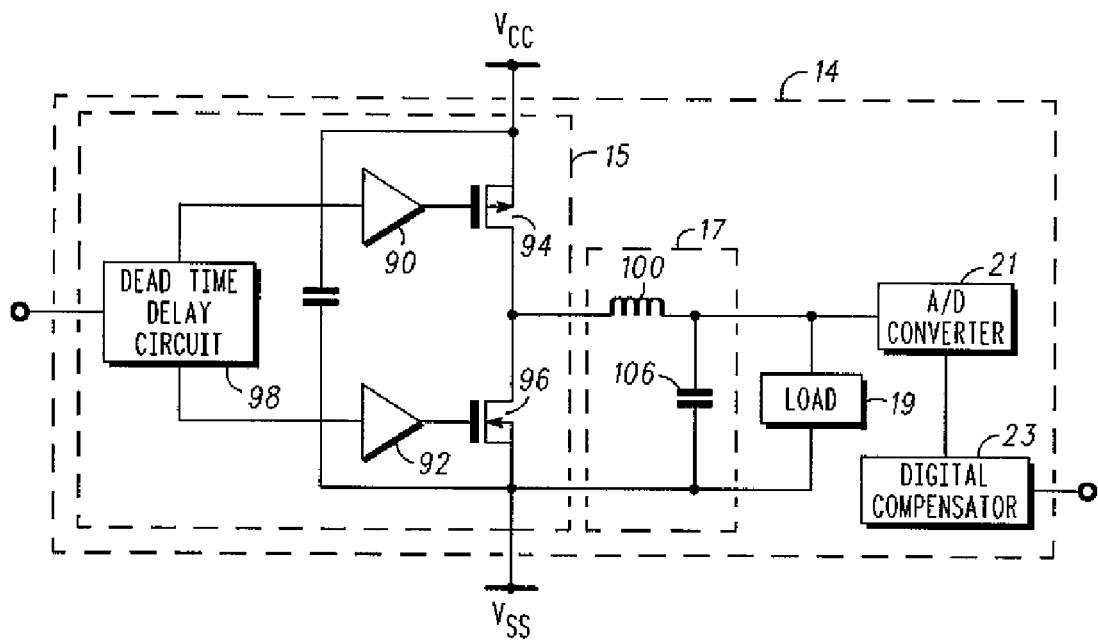
FIG. 6 is a schematic diagram of another portion of the digitally controlled power converter of FIG. 1 in accordance with another embodiment of the present invention.

FIG. 6 illustrates a block diagram of a switching network 14 comprising power converter 15, filter stage 17, load 19, ADC 21, and digital compensator 23 in accordance with an embodiment of the present invention. By way of example, power converter 15 is a buck converter comprising driver circuits 90 and 92 coupled for driving switching Field Effect Transistors ("FETS") 94 and 96, respectively. More particularly, an output of driver circuit 90 is connected to the gate of switching FET 94 and an output of driver 92 is connected to the gate of switching FET 96. The drains of switching FETS 94 and 96 are connected together, the source of switching FET 94 is coupled for receiving a source of operating potential such as, for example, $V_{CC}$, and the source of switching FET 96 is coupled for receiving a source of operating potential such as, for example, $V_{SS}$. An output of a dead time delay circuit 98 is connected to the input of driver circuit 90 and another output of dead time delay circuit 98 is connected to the input of driver circuit 92. An input of dead time delay circuit 98 is connected to output 30 of delay-line DPWM 22.

Filter stage 17 comprises an inductor 100 connected to a capacitor 106. More particularly, one terminal of inductor 100 is connected to the drains of transistors 94 and 96 and the other terminal of inductor 100 is connected to a terminal of capacitor 106. The other terminal of capacitor 106 is coupled for receiving a source of operating potential such as, for example, $V_{SS}$.

Load 19 is coupled across capacitor 106.

An input of ADC 21 is coupled to the drains of switching transistors 94 and 96 through inductor 100.

An output of ADC 21 is connected to a the commonly connected terminals of inductor 100, capacitor 106, load 19, and an input of digital compensator 23. An output of digital compensator 23 serves as output 25 of switching network 14 and is connected to input 26 of delay-line DPWM 22.

In operation, a spread spectrum clock generation technique is used for reducing EMI in a digital circuit by varying the switching frequency of switching network 14 so that noise generated by switching circuits such as, for example, an SMPS, is spread across a frequency band, thereby reducing the time averaged fundamental peak amplitude of the noise at a particular frequency. In accordance with an embodiment of the present invention, a clock divider 38 receives a system clock signal ($CLK_{SYS}$) and provides a clock signal ($CLK_{DIV}$) having a reduced frequency to LSFR 40, which generates a uniformly distributed frequency target. By way of example, LSFR 40 is a 9-element linear feedback shifter register which generates a 512 cycle pseudo-random sequence to achieve a uniformly distributed frequency target. A 7-bit number representing a spread spectrum frequency $freq_{ss}$ is extracted from the LSFR 40.

A summer circuit 42 introduces an offset in the 7-bit number to produce a level shifted 7-bit number. DAC 18 converts the shifted offset number into a reference voltage $V_{REF}$. By way of example, DAC 18 is a one-bit delta-sigma ("ΔΣ") DAC that includes a digital modulator 50 and a low pass filter 52. Linear regulator 20 converts reference voltage $V_{REF}$ into an output voltage that serves as the supply voltage $V_{DD}$ for delay elements $64_1$-$64_n$. Thus, the supply voltage is controlled by linear regulator 20 whose reference voltage $V_{REF}$, is varied to achieve a variable switching frequency, $f_s$, for switching network 14. Thus, supply voltage $V_{DD}$ serves as a control signal of delay-line DPWM that varies the frequency of digitally controlled power converter 10. It should be noted that the control signal is not limited to being the supply voltage.

By now it should be appreciated that a digital spread spectrum circuit and method for reducing EMI using a digital spread spectrum have been provided. In accordance with an embodiment of the present invention, the method includes varying an operating parameter of a delay-line DPWM circuit so that it generates a signal having a variable frequency. In accordance with one embodiment the operating parameter is a clock frequency. This signal is input into a switching network so that the digitally controlled power converter has a variable switching frequency.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for reducing electromagnetic interference in a digitally controlled power converter, comprising creating a spread spectrum by randomly varying a clock frequency of a delay line digital pulse width modulator circuit having an output that is a system clock and another output that is a pulse-width modulated signal.

2. The method of claim 1, wherein randomly varying the clock frequency includes changing a control signal of the delay line digital pulse width modulator circuit.

3. The method of claim 2, wherein randomly varying the clock frequency includes changing a supply voltage of the delay line digital pulse width modulator circuit.

4. The method of claim 2, wherein randomly varying the clock frequency includes varying a reference voltage of a regulator.

5. The method of claim 4, wherein randomly varying the clock frequency further includes using a linear feedback shift register.

6. The method of claim 5, further including extracting a signal from the linear feedback shift register and converting the signal to a reference voltage.

7. The method of claim 6, further including converting the signal to the reference signal by using a one-bit sigma-delta digital-to-analog converter.

8. The method of claim 1, wherein randomly varying the clock frequency includes transmitting pseudo-random digital codes to a noise shaping digital-to-analog converter.

9. The method of claim 8, wherein the noise shaping digital-to-analog converter is a one-bit noise shaping digital-to-analog converter.

10. A method for inhibiting interference by electromagnetic radiation comprising varying an operating parameter of a delay line digital pulse width modulator, wherein varying the operating parameter includes varying a control voltage of a portion of the delay line digital pulse width modulator.

11. The method of claim 10, wherein varying the control voltage comprises changing a supply voltage of a delay element of the delay-line based digital pulse width modulator.

12. The method of claim 11, wherein varying the clock frequency includes varying a system clock frequency.

13. The method of claim 10, wherein varying the control voltage further comprises generating a reference voltage and varying the reference voltage.

14. The method of claim 13, wherein generating the reference voltage includes using a digital-to-analog converter to generate and vary the reference voltage.

15. A method for inhibiting electromagnetic interference, comprising varying an operating parameter of a delay line to achieve a varying system clock frequency to generate a digital spread spectrum and varying a control voltage, wherein varying the control voltage comprises changing a supply voltage of a delay line element of the delay line digital pulse width modulator circuit, and further including using a first output signal from the delay-line digital pulse width modulator to provide the system clock frequency and using a second output signal from the delay-line digital pulse width modulator as an input signal to a power converter.

16. The method of claim 15, wherein varying the control voltage further comprises generating a reference voltage and varying the reference voltage.

17. The method of claim 16, wherein generating the reference voltage includes using a digital-to-analog converter to generate and vary the reference voltage.

* * * * *